(12) United States Patent
Waelchli

(10) Patent No.: US 10,551,437 B2
(45) Date of Patent: Feb. 4, 2020

(54) ERROR RATE METER INCLUDED IN A SEMICONDUCTOR DIE

(71) Applicant: SEMICONDUCTOR COMPONENTS INDUSTRIES, LLC, Phoenix, AZ (US)

(72) Inventor: Gregoire Waelchli, Bienne (CH)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 15/895,784

(22) Filed: Feb. 13, 2018

(65) Prior Publication Data

US 2019/0025372 A1   Jan. 24, 2019

Related U.S. Application Data

(60) Provisional application No. 62/534,775, filed on Jul. 20, 2017.

(51) Int. Cl.
| | | |
|---|---|---|
| *G01R 31/3177* | (2006.01) | |
| *G11C 29/46* | (2006.01) | |
| *G06F 11/16* | (2006.01) | |
| *G06F 11/27* | (2006.01) | |
| *G01R 31/317* | (2006.01) | |
| *G11C 7/10* | (2006.01) | |

(52) U.S. Cl.
CPC ... *G01R 31/3177* (2013.01); *G01R 31/31701* (2013.01); *G06F 11/167* (2013.01); *G06F 11/27* (2013.01); *G11C 29/46* (2013.01); *G11C 7/1045* (2013.01)

(58) Field of Classification Search
CPC .......... G01R 31/3177; G01R 31/31701; G11C 29/56012; G11C 29/56016; G11C 29/46; G11C 29/56008; G11C 7/1045; G06F 11/167; G06F 11/27
USPC ........................................................ 714/724
See application file for complete search history.

(56) References Cited

U.S. PATENT DOCUMENTS

| | | | |
|---|---|---|---|
| 7,574,633 B2 * | 8/2009 | Sato ................. | G01R 31/31922 365/201 |
| 7,757,144 B2 * | 7/2010 | Lai .................... | G11C 29/56012 714/744 |
| 8,327,206 B2 * | 12/2012 | Tran .................. | H04L 12/40013 714/704 |
| 2003/0142737 A1 | 7/2003 | Tarng | |
| 2004/0148580 A1 | 7/2004 | de Obaldia et al. | |

(Continued)

*Primary Examiner* — James C Kerveros
(74) *Attorney, Agent, or Firm* — Brake Hughes Bellermann LLP

(57) ABSTRACT

An apparatus for performing an electrical test at a device is described. In one general implementation, an apparatus may include a memory, a receiver, and a processor. The receiver is configured to receive a test signal, convert the test signal into a digital test signal (bit stream) and store the digital test signal in the memory. The receiver identifies when a predefined number of bits of the bit stream are available in the memory. The processor is configured to perform a logic operation on the bit stream and a reference signal, generate a test result based on the logic operation, and determine whether the test result satisfies a condition. In some implementations, the processor may be configured to synchronize the digital test signal with the reference signal prior to performing of the logic operation.

17 Claims, 8 Drawing Sheets

(56) References Cited

U.S. PATENT DOCUMENTS

| | | | |
|---|---|---|---|
| 2004/0268190 A1* | 12/2004 | Kossel | H04L 1/20 |
| | | | 714/704 |
| 2007/0014341 A1 | 1/2007 | Rowse et al. | |
| 2008/0016422 A1* | 1/2008 | Ochi | G01R 31/31725 |
| | | | 714/735 |
| 2009/0115443 A1* | 5/2009 | Lai | G11C 29/56 |
| | | | 324/759.01 |
| 2009/0119053 A1* | 5/2009 | Tseng | G06F 11/27 |
| | | | 702/117 |
| 2010/0312507 A1* | 12/2010 | Uematsu | G01R 31/31725 |
| | | | 702/79 |
| 2011/0128044 A1* | 6/2011 | Tamura | G01R 31/31908 |
| | | | 327/5 |

* cited by examiner

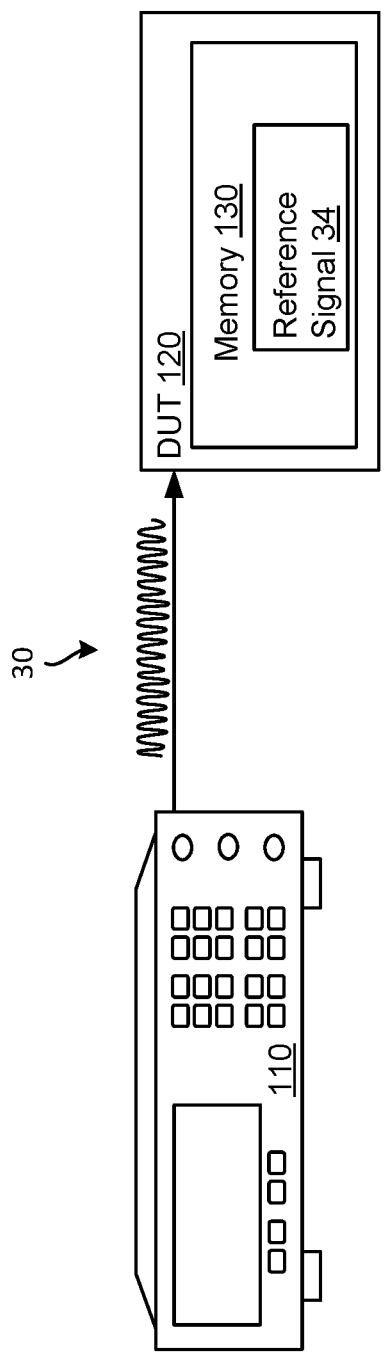
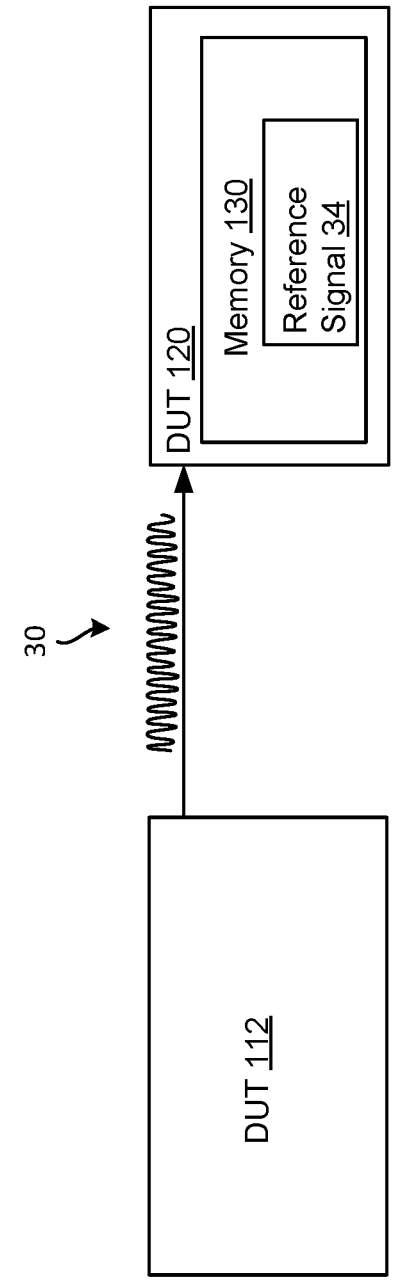
FIG. 1A
FIG. 1B

ERROR RATE METER INCLUDED IN A SEMICONDUCTOR DIE

RELATED APPLICATION

This application claims priority to and the benefit of Provisional Patent Application No. 62/534,775 filed on Jul. 20, 2017, which is incorporated herein by reference in its entirety.

TECHNICAL FIELD

Some implementations relate generally to an error rate meter included in a semiconductor die.

BACKGROUND

A semiconductor die after being manufactured can be tested using a variety of hardware test equipment to determine whether or not the semiconductor die has desirable performance characteristics. The various hardware test equipment can perform many electrical tests on the semiconductor die using numerous test criteria. The use of different test equipment and criteria can result in additional costs and time, which is undesirable in many applications.

SUMMARY

A device including electrical self-testing capabilities is described herein. In one general implementation, an apparatus may include a memory, a receiver, and a processor. The receiver is configured to receive a test signal, convert the test signal into a digital test signal (bit stream), store the digital test signal in the memory, and identify when a pre-defined number of bits of the bit stream are available in the memory. The processor is configured to perform a logic operation on the bit stream and a reference signal, generate a test result based on the logic operation, and determine whether the test result satisfies a condition. In some implementations, the processor may be configured to synchronize the digital test signal with the reference signal prior to performing the logic operations.

BRIEF DESCRIPTION OF THE DRAWINGS

FIG. 1A illustrates an example system to perform an electrical test at a device under test.

FIG. 1B illustrates another example system to perform an electrical test at a device under test.

DETAILED DESCRIPTION

Figure 1C:
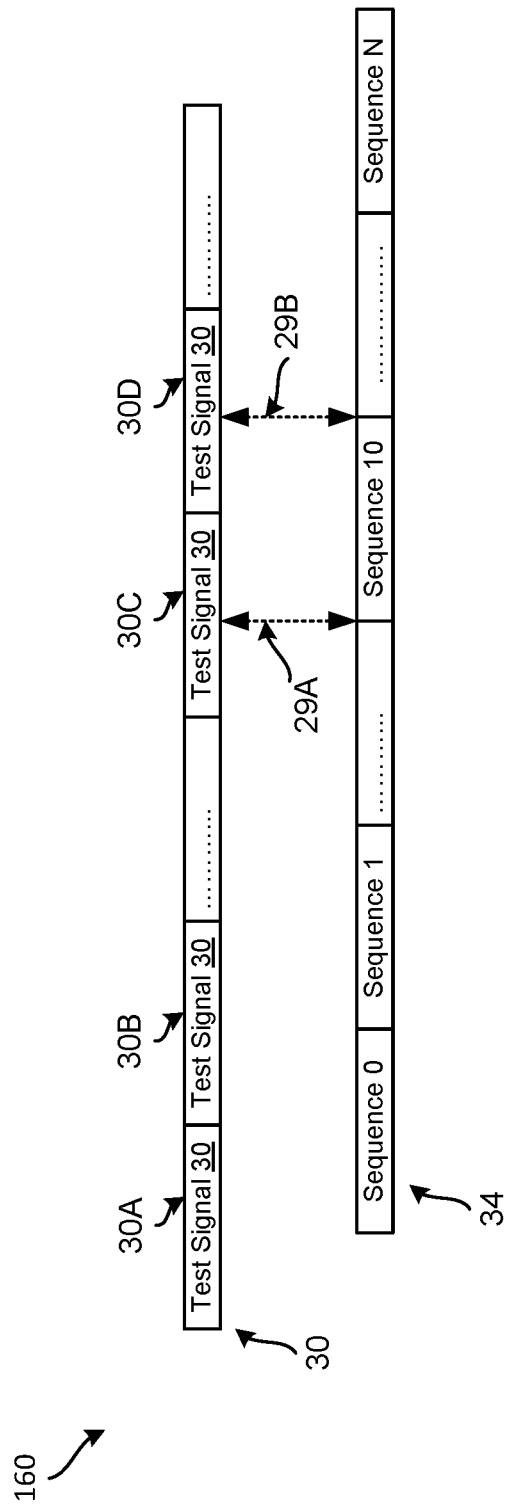
FIG. 1C illustrates an example synchronization between a test signal and a reference signal.

An example device (or apparatus), which can be referred to as a device under test (DUT), configured to perform electrical self-testing is described herein. The testing may be performed to determine whether the device has the desired performance characteristics. In some implementations, the device may receive a test signal from test equipment and the received test signal may be compared with a reference signal stored at the device. The comparison may be used to determine whether the device has the desired performance characteristics.

In one example implementation, the device may include a receiver, a processor, and a memory. The receiver may receive a test signal from test equipment (e.g., a device which can generate a test signal). The receiver converts the test signal into a digital test signal (e.g., bit stream) and stores the bit stream in the memory. Once a certain number of bits of the bit stream are available in the memory, the receiver may compare the bit stream with a reference signal stored in the memory. The reference signal may include a plurality of phase-shifted versions of a sequence which may be, for example, a pseudorandom binary sequence (PRBS).

The comparing determines whether bits of the bit stream match with corresponding bits of the reference signal to determine whether the bit stream was correctly received at the receiver. The total number of bits of the bit stream that were not received correctly (e.g. received in error, number of mismatched bits, etc.) at the receiver may be used to determine a test result. The test result may be used then to determine whether the test result satisfies a condition, for example, by comparing to a threshold value associated with the test result. In some implementations, the test result may be used to determine whether the device passes a bit error rate (BER) test or the BER satisfies BER threshold value to determine whether the device has the desired performance characteristics.

The implementations described herein may be advantageous over, for example, a system that requires an external trigger event, exchanging of test parameters, additional test equipment, and so forth. In some implementations, the self-testing mechanisms described herein can eliminate test equipment and/or measurement capabilities and/or may obviate additional circuitry to implement the testing on-chip. In some implementations, the mechanisms described herein may provide common metrics for DUT characterization, production, and in-the-field application. The metrics may be computed in real-time with minimal processor load, without any external triggers, and with minimal RF interference. The other advantages of the implementations described herein may include, for example, organizing of subsequences in a memory so that the memory can read linearly without any further data manipulations, achieving real-time operations with minimal processing resources, absence of any feedback mechanism (clock or data signals) to the transmitter as the metrics are computed locally (for example, on chip), and the ability to test two devices together in the field with one device being used as a transmitter and the other device being used as the receiver and computing the metrics.

FIG. 1A illustrates an example system 100 with a DUT 120 configured to perform an electrical test (e.g., BER, PER, etc.), for example, on-chip, in response to receiving a test signal 30 (e.g., a radio frequency (RF) signal, known data, a known sequence, etc.) from test equipment 110 (e.g., a test signal generator). As the DUT 120 is configured to perform the test on-chip, the DUT 120 does not send a demodulated clock or data signal back to the test equipment 110 (or another device) for further processing. The DUT 120 may include a memory 130 which may have reference signal 34 stored in the memory 130. The DUT 120 may compare the test signal 30 received from the test equipment 110 with the reference signal 34 stored in the memory 130 to determine whether the DUT 110 satisfies the desired performance characteristics. In some implementations, the DUT 110 may include a module to produce the test signal 30.

In wireless communications, e.g. Bluetooth low energy (LE) communications, bit error rate (BER) and packet error rate (PER) are two example metrics that may be used for measuring sensitivity of a receiver at the DUT 120 (also referred to as sensitivity of the DUT 120). The BER may be generally defined as the number of bits received in error (e.g., bit errors) divided by the total number of received bits. The PER may be generally defined as number of error packets divided by the total number of received packets. These metrics may be generally used to determine whether the device satisfies the desired performance characteristics.

In one implementation, the BER may be computed on-chip in the DUT 120 instead of being computed externally due to numerous disadvantages of computing externally. For instance, if the BER were computed externally instead of on-chip in the DUT 120, demodulated clock and data bit streams would be sent back (e.g., feedback mechanism) from the DUT 120 to the test equipment 110 (or another computing device) to compute the number of erroneous bits. In such a test configuration, the BER test may rely on a specific signal generator with clock and data inputs. In addition, the demodulated clock and data bits can generate toggling activity on DUT pads that interfere with the input signal and cause artificial sensitivity degradation which is pad voltage dependent. Moreover, possible reflections on the clock and data lines can cause artificial degradation, especially on test equipment that is automated.

In another implementation, the DUT 120 may be, or may include, an on-chip receiver sensitivity test for use in an integrated transceiver (e.g., radio frequency (RF) transceiver). The mechanism of the DUT 120 described herein may obviate the need to use test equipment with BER measurement capabilities or may obviate additional circuitry to realize the test mechanism on-chip. The DUT 120 described herein may include on-chip test signal processing or reference signal generation. In some implementations, the mechanisms described herein may be software-based and may be implemented using a reprogrammable processing unit included in the DUT 120. In some other implementations, the mechanisms described herein may be implemented in the hardware of the DUT 120. The results of the testing may determine whether the sensitivity requirements of the receiver are satisfied or met. In some implementations, the test equipment 110 may be any RF capable device, and may be replaced with another device, as shown for example, in FIG. 1B.

In one implementation, the test signal 30 may be synchronized with the reference signal 34 for properly comparing the test signal 30 with the reference signal 34. The synchronization may be needed as the phase of the test signal (e.g., starting of the test signal) may be unknown, as described below in detail in reference to FIG. 1B.

FIG. 1B illustrates another example system 150 to perform an electrical test at a device under test.

In some implementations, the test equipment may be another DUT, for example, DUT 112. For example, two devices (e.g., DUT 112 and DUT 120) may be tested against each other with a first device, e.g., DUT 112, generating a test signal (e.g., test signal 30) and a second device, e.g., DUT 120, measuring sensitivity (e.g., whether the DUT 120 satisfies the desired performance characteristics). This may be performed in the field to validate, for example, integration of a DUT into a system or a network, or to measure the quality of reception in a given environment (e.g., to measure quality of a Bluetooth low energy (BLE) link between two devices). In another implementation, the DUT 120 may generate the test signal and the DUT 112 may measure sensitivity.

FIG. 1C illustrates an example synchronization 160 between a test signal and a reference signal.

As shown in FIG. 1B, the test signal 32 may be in a continuous loop (e.g., 30A, 30B, 30C, 30D, etc.) and the phase of the test signal 30 may be unknown. In other words, the starting point of the test signal 30 may be unknown. However, the DUT 120 needs knowledge of the starting point of the test signal 30 for performing a bitwise (e.g., bit-by-bit) comparison between the test signal 30 and the reference signal 34. In the absence of such information, the DUT 120 may perform synchronization between the test signal 30 and the reference signal 34 prior to comparison.

As shown in 160 of FIG. 1B, in one implementation, the test signal 30 may be in a continuous loop and the reference signal 34 may include a sequence, e.g., a plurality of sequences (e.g., sequence 0, sequence 1, . . . , sequence N). The DUT 120 may perform a correlation between the test signal 30 (or digital version of the test signal 30) and the reference signal 34. For instance, the DUT 120 may perform correlation between the test signal 30 (e.g., 30A, 30B, 30C, 30D, etc. which is a repetition of the test signal 30) and the sequences (e.g., sequence 0, sequence 1, . . . , sequence N) of the reference signal 34 to find a match, as shown, for example, at 29A and 29B. That is, 29A and 29B may show the start and end points in the bit stream where there is phase match between the test signal 30 (being repeated) and a sequence (e.g., sequence 10) of the reference signal 34. Once the DUT 120 finds a match between the test signal 30 and a sequence of the reference signal 34 (e.g., correlation is maximum), the test signal 30 and the reference signal 34 may be synchronized at the matching word-line address location.

In one example implementation, the test signal 30 may be in a continuous loop. The reference signal 34 may be a pre-defined finite sequence, for example, a PRBS9 which may include all possible phase-shifted versions of a sequence (for a total of 32 sequences), and the sequence may be the same signal as the test signal 30. Each sequence may include 15 or 16 subsequences resulting in a total of 511 possible subsequences or phases for the reference signal. The DUT 120 may perform a correlation between the test signal 30 (or digital version of the test signal 30) and the various sequences of the reference signal 34. For instance, the DUT 120 may perform correlation between the test signal 30 (e.g., 30A, 30B, 30C, 30D, etc. which is a repetition of the test signal 30) and the various sequences (e.g., sequence 0, sequence 1, sequence 29, etc.) of the reference signal 34 to find a match as shown by 29A and 29B. That is, 29A and 29B may show the start and end points in the bit stream where there phases match between the test signal 30 (being repeated) and (the sequence 29 of) the reference signal 34. Once the DUT 120 finds a match between the test signal 30 and a sequence of the reference signal 34 (e.g., correlation is maximum), the test signal 30 and the reference signal 34 may be synchronized at the matching word-line address location. In some implementations, the correlation may be computed over a subsequence instead of a sequence due to properties of PRBS9 and the low BER target (e.g., $10^{-3}$). Additional details on example synchronization processes are described in reference to at least FIGS. 5A-5C.

Figure 2:
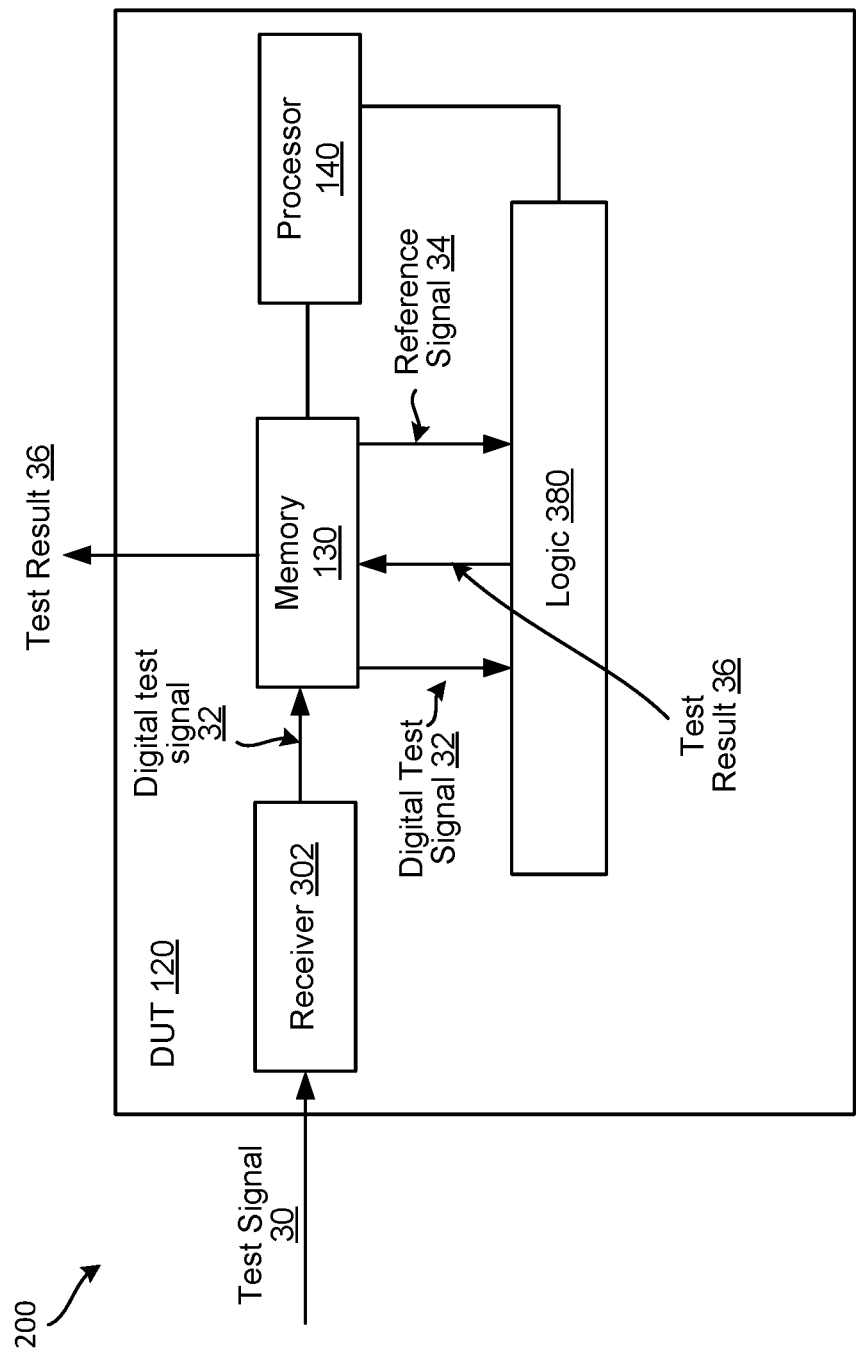
FIG. 2 illustrates an example system for performing an electrical test at a device under test.

FIG. 2 illustrates an example system 200 for performing an electrical test at the DUT (e.g., DUT 120). The DUT 120 shown in FIG. 2 can be an example of the DUT illustrated in, for example, FIG. 1A. In some implementations, the electrical test may be a BER test for determining whether a receiver 302 (e.g., a RF receiver) of the DUT 120 satisfies a test condition, e.g., threshold sensitivity requirements.

In one example implementation, the DUT 120 may include a processor 120, the memory 130, a receiver 302, and/or other components such as a logic operations component, e.g., logic 380, for performing logic operations. The memory 130 is also referred to as a DUT memory, device memory, or a DUT memory portion.

The receiver 302 of the DUT 120 may receive the test signal 30 from test equipment (e.g., test equipment 110), as shown in FIG. 1. The test signal 30 may be a known signal, for example, a known data or a sequence (e.g., a pseudorandom binary sequence (PRBS), PRBS 9). The receiver 302 may convert the test signal 30 into a digital test signal 32. The digital test signal 32 may be a bit stream (e.g., stream of bits) which is stored in a memory. In some implementations, the memory may be a portion of the memory 130 or a local first-in first-out (FIFO) memory of the receiver 302. The memory used for storing the digital test signal 32 is also referred to as a receiver memory or a receiver memory portion.

The DUT 120 compares the digital test signal 32 to the reference signal 34 for determining whether the receiver 302 of the DUT 120 satisfies threshold sensitivity requirements. The reference signal 34 may be a known sequence, e.g., same as the test signal 30, which may be pre-generated and stored in the memory 130 for processing with the digital test signal 32 using logic 380. In some implementations, the reference signal 34 may be a pseudorandom binary sequence (PRBS), e.g., PRBS9. The logic 380 (e.g., 8-bit logic, 16-bit logic, 32-bit logic, etc.) may be configured to perform a test (e.g., BER test) at the DUT 120 to determine whether the test is successful (e.g., whether the receiver 302 of the DUT 120 satisfies threshold sensitivity requirements) and displays the test result 36. In other words, the digital test signal 32 that is converted from the test signal 30 (e.g., a known sequence) is compared to the sequence (e.g., same sequence) that is locally stored to determine whether certain conditions are met, for example, whether bit error ratio based on the comparison between the digital test signal 32 and the reference signal 34 them satisfies a certain condition (e.g., satisfies sensitivity requirements). In other words, a known signal that is received over a wireless medium at the receiver 302 is compared with the known signal (or phase shifted versions of the known signal) stored at the device to determine if the known signal was correctly received, and therefore, whether the receiver meets the sensitivity requirements.

Figure 3:
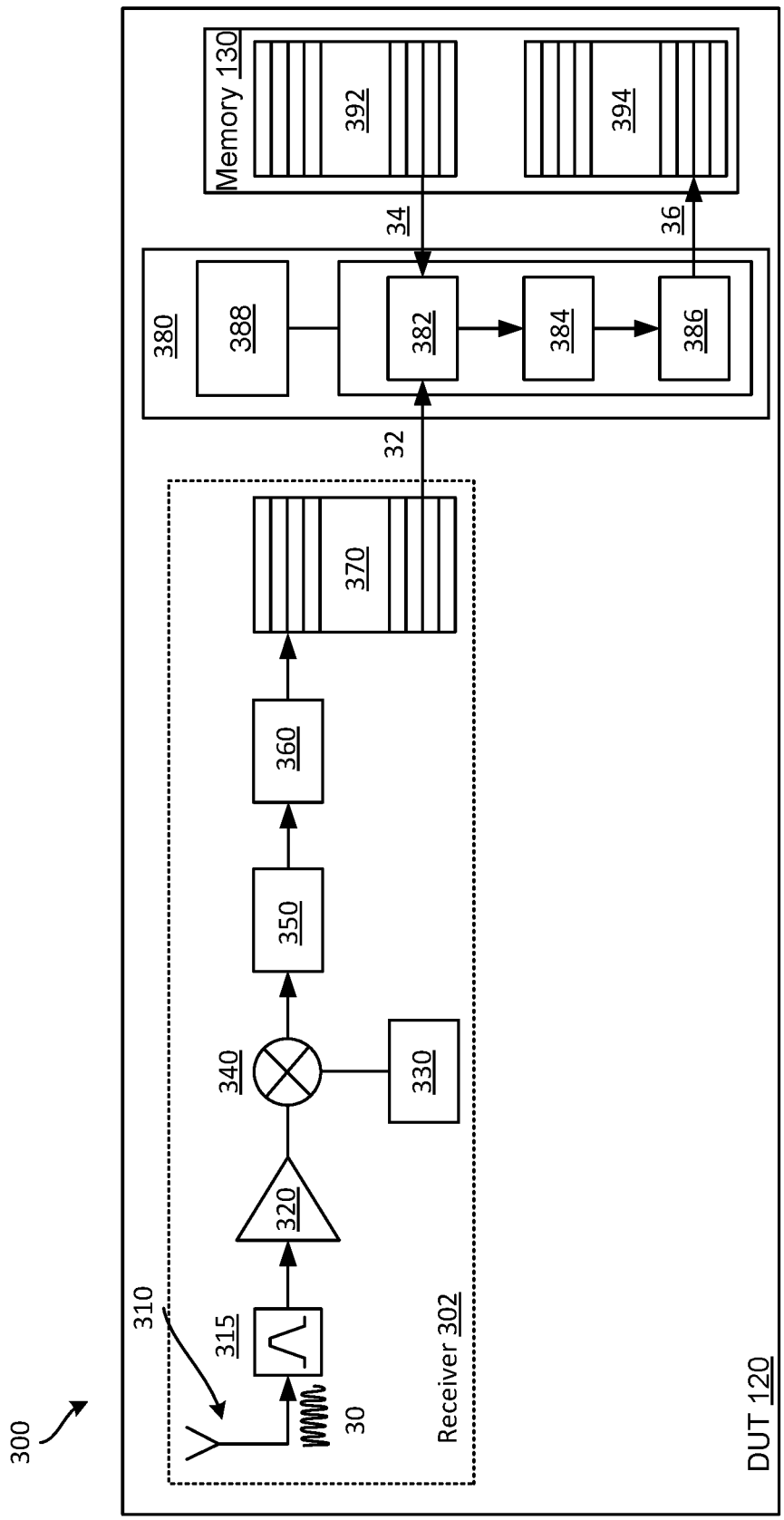
FIG. 3 illustrates one more example system for performing an electrical test at a device under test.

FIG. 3 illustrates an example system 300 for performing a test at a DUT (e.g., DUT 120). The DUT 120 may include receiver 302, synchronization logic 380 (can be referred to as logic), and a memory 130.

The receiver 302 may include at least an antenna 310, a filter 315, a low noise amplifier (LNA) 320, a voltage controlled oscillator (VCO) 330 (e.g., a local oscillator), a mixer 340 (e.g., an ideal mixer, a multiplier), an automatic gain control 350, an analog to digital converter 360, or a memory 370 for receiving a test signal 30, converting the test signal 30 to the digital test signal 32, storing the digital test signal 32 in the memory 370, or identifying when a pre-defined number of bits are available in the memory 370. The identifying may be based, for example, on an interrupt (a system interrupt, a direct memory access request, etc.) Although the receiver 302 is shown with various components, in some implementations, the receiver 302 may include different components than shown in FIG. 3. In some implementations, the receiver 302 may be configured to demodulate the test signal 30 and generate a bit stream (e.g., digital test signal 32), and for example, at a rate of 1 Mb/s for a BLE link. The receiver 302 may be configured with a reprogrammable CPU (not shown in FIG. 3) and some memory (e.g., memory 370, which may be a local FIFO memory at the receiver 302 or a portion of the memory 130) to perform the operations described herein.

The receiver 302 may be configured to receive the test signal 30 via the antenna 310 and is configured to produce the digital test signal 32 that may be stored in the memory 370. In some implementations, the memory 370 may be a FIFO memory of the receiver 302 or a portion of the memory 130. The reference signal 34 may be stored in memory 392, which may be a part of the memory 130 in some implementations, and may be processed with the digital test signal 32 using logic 380. In some implementations, the reference signal 34 may be a pseudorandom binary sequence (PRBS), e.g., PRBS9.

In some implementations, the logic 380 may include XOR comparison logic 382, summation logic 384, or result logic 386. The XOR comparison logic 382 compares the digital test signal 32 with the reference signal 34, e.g., on a per-bit basis, and may produce a logic value, e.g., a logic high value or a value of 1, if the comparison results in a mismatch (bits do not match). For instance, a value of 1 may be produced in the event a bit of the digital test signal 32 does not match with a corresponding bit of the reference signal 34 (e.g., corresponding bit of the corresponding sequence of the reference signal). A value of 0 may be produced in the event a bit of the digital test signal 32 matches with a corresponding bit of the reference signal 34.

The summation logic 384 may be configured to add total number of unmatched bits (or matched bits) based on the comparison performed using the XOR comparison logic 382. The result logic 386 may be configured to determine whether the test result 36 satisfies the condition based on a test criterion configured at the device, the test criterion based on the total number of bits that failed to match. In some implementations, the test criterion (e.g., which may be pre-defined by the manufacturer of the chip or the DUT 120) may be based on the total number of unmatched bits. The test result 36 may be used to determine whether the receiver 302 of the DUT 120 passed the test (e.g., satisfied threshold sensitivity requirements). In other words, the result logic 386 may determine the test result 36, e.g., BER, and may determine whether the BER satisfies the threshold hold sensitivity requirements. In some implementations, the test result may be stored in the memory 394 which is a portion of the memory 130.

In one implementation, the logic 380 may include synchronization logic 388. The logic 388 may be configured to facilitate synchronization between the digital test signal 32 and the reference signal 34. Without proper synchronization between the digital test signal 32 and the reference signal 34, an accurate comparison of the digital test signal 32 and the reference signal 34 cannot be performed in a desirable fashion. For example, the test signal 30 may be in a continuous loop and processed by the receiver 302 continuously resulting in the need for synchronization between the digital test signal 32 and reference signal 34. In another example, the receiver 302 may be configured to continuously receive a looped version of a known test signal or code modulated as the test signal 30. To improve the efficiency of the synchronization process, in some implementations, the reference signal 34 may be pre-computed (e.g., pre-generated) and stored in the memory 392 prior to the synchronization process as the generation of the reference signal 34 may consume significant processing resources. Additional details on the synchronization process are described in detail at least in reference to FIGS. 5A-5C.

In another implementation, the system or mechanism shown in FIG. 3 may be used to implement a BER meter in software (e.g., software BER meter) directly on-chip of the DUT 120. The software may be configured to compute the BER in real-time with reduced (e.g., minimal) processing load, for example, in part, due to pre-computing (e.g., pre-generating) the reference signal 34 and storing the reference signal 34 in the memory 392. The reference signal 34 which may be pre-generated may include a plurality of phase-shifted versions of a sequence that may be used to automatically synchronize the digital test signal 32 with the reference signal 34, thus obviating the need for any external trigger or external synchronization mechanism.

In one more implementation, in response to identifying a pre-defined number of bits of the bit stream are available in the memory 370, the processor 120 may execute logic 380 and load the digital test signal 32 from the memory 370, the reference signal 34, and compute the correlation between the digital test signal 32 and the reference signal 34 using the logic 380. In some implementations, the comparison (e.g., correlation) may be implemented as a bitwise XOR operation. In some implementations, each resulting bit being set to a high value may correspond to an erroneously processed (e.g., received) bit. In some implementations, the logic 382 may be configured to compute the amount of ones (1s) of the XOR operation. In some implementations, since the number of errors is expected to be null or low, an algorithm (e.g., in logic 380) with a complexity proportional to the number of ones may be used. For example, in some implementations, the logic 380 may be configured to detect a scenario where there are no mismatches between the digital test signal 32 and the reference signal 34. In such situations, the calculation of an error rate will not be completed because it is not needed. If there is a mismatch between the digital test signal and the reference signal, the calculation of an error rate may be triggered. In some implementations, the test result 36 of the result operation may be defined (e.g., accumulated, collected, calculated) over, for example, a pre-defined amount of data and stored in the memory 394. In some implementations, the test result 36 may be a BER calculated as the ratio between the number of erroneously received bits and the total amount of received bits.

In some implementations, at least some portions of the processing illustrated in FIG. 3 may be performed in software, hardware, firmware, or a combination thereof. Accordingly, all, or a portion, of the processing may be executed using, for example, one or more general purpose processors and/or one or more memories.

Figure 4:
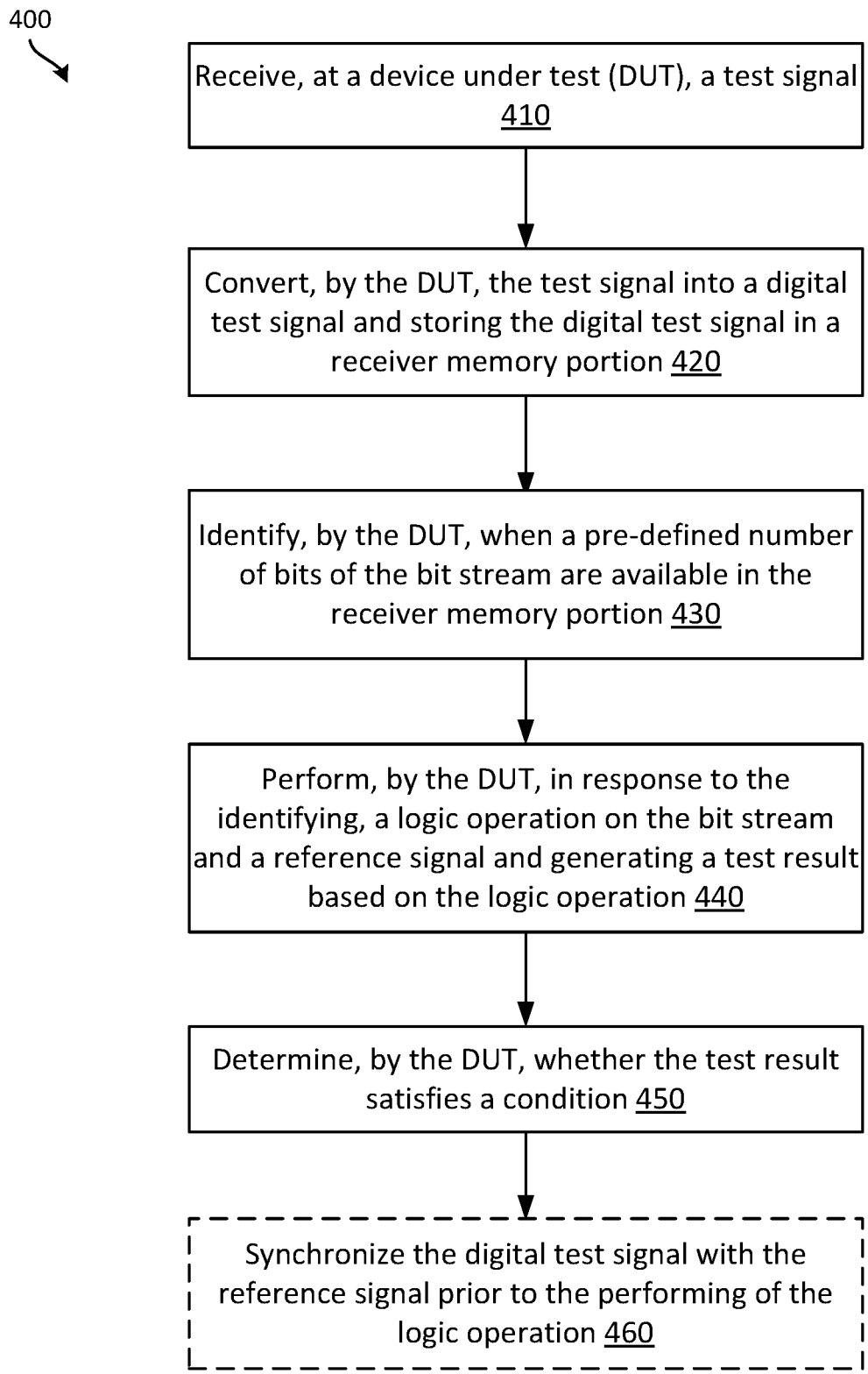
FIG. 4 illustrates an example method for executing an electrical test at a device under test.

FIG. 4 illustrates a flowchart 400 of an example method of executing an electrical test at a DUT (e.g., at DUT 120 as shown in FIGS. 1A-3). In some embodiments, at least some portions of the method can be performed using a non-transitory computer-readable storage medium storing instructions that when executed cause a processor to perform the method.

At block 410, the DUT receives a test signal. For example, in one implementation, the DUT 120 or the receiver 302 may receive the test signal 30, via the antenna 310, from the test equipment 110. In some implementations, the test signal 30 may be a RF test signal and the receiver 302 may be a RF receiver configured to receive the test signal 30. As described above, the test signal 30 may be a known data signal, e.g., a sequence.

At block 420, the DUT may convert the test signal into a digital test signal and store the digital test signal in a receiver memory portion, the digital test signal being a bit stream generated from the test signal. For example, in one implementation, the DUT 310, the receiver 302, or the analog to digital converter 360 may convert the test signal 30 into a digital test signal 32 (e.g., bit stream, sequence of bits, etc.) and store the digital test signal 32 in a receiver memory portion (e.g., memory 370). The receiver memory portion 370 may be a local memory at the receiver 302 (e.g., FIFO memory at the receiver 302) or a portion of the memory 130. In some implementations, the digital test signal 32 may be temporarily stored in the memory, for example, as 8, 16, or 32 bit data.

At block 430, the DUT may identify when a pre-defined number of bits of the bit stream are available in the receiver memory portion. For example, in one implementation, the DUT 100 or the receiver 302 may identify when a pre-defined number of bits of the bit stream are available in the receiver memory portion 370. In some implementations, the identifying may be based on an interrupt, for example, a system interrupt, a direct memory access request, etc.

At block 440, the DUT 100 may perform, in response to the identifying, a logic operation on the bit stream and a reference signal, and generate a test result based on the logic operation. For example, in one implementation, in response to the identifying, the DUT 100 or the processor 140 may perform a logic operation on the bit stream (e.g., digital test signal 32) and the reference signal 34, and may generate the test result 36 based on the logic operation.

At block 450, the DUT may determine whether the test result satisfies a condition. For example, in one implementation, the DUT 100 or the processor 140 may determine whether the test result 36 satisfies a condition, e.g., threshold sensitivity requirements. In some implementations, the DUT 120 or the processor 140 may determine whether BER test results satisfies threshold sensitivity requirements. The DUT 120 or the processor 140 may determine that the BER test result satisfies the condition if the BER is below the BER threshold sensitivity requirement of the receiver 302.

In some implementations, at block 460, the DUT may synchronize the digital test signal with the reference signal prior to performing of the logic operation. For example, in one implementation, the DUT 120 or the processor 140 may synchronize the digital test signal 32 with the reference signal 34 prior to performing the logic operation to efficiently perform the logic operation described above in reference to block 440.

The reference signal 34, as described above in FIGS. 1A-4, may include a plurality of phased-shifted versions of a sequence (e.g., PRBS9). In some implementations, the reference signal 34 may be pre-generated and stored in the memory 392 in a word aligned manner to improve speed or efficiency of the synchronization or logic operations which are described below in detail in reference to at least FIGS. 5A-5C.

Figure 5A:
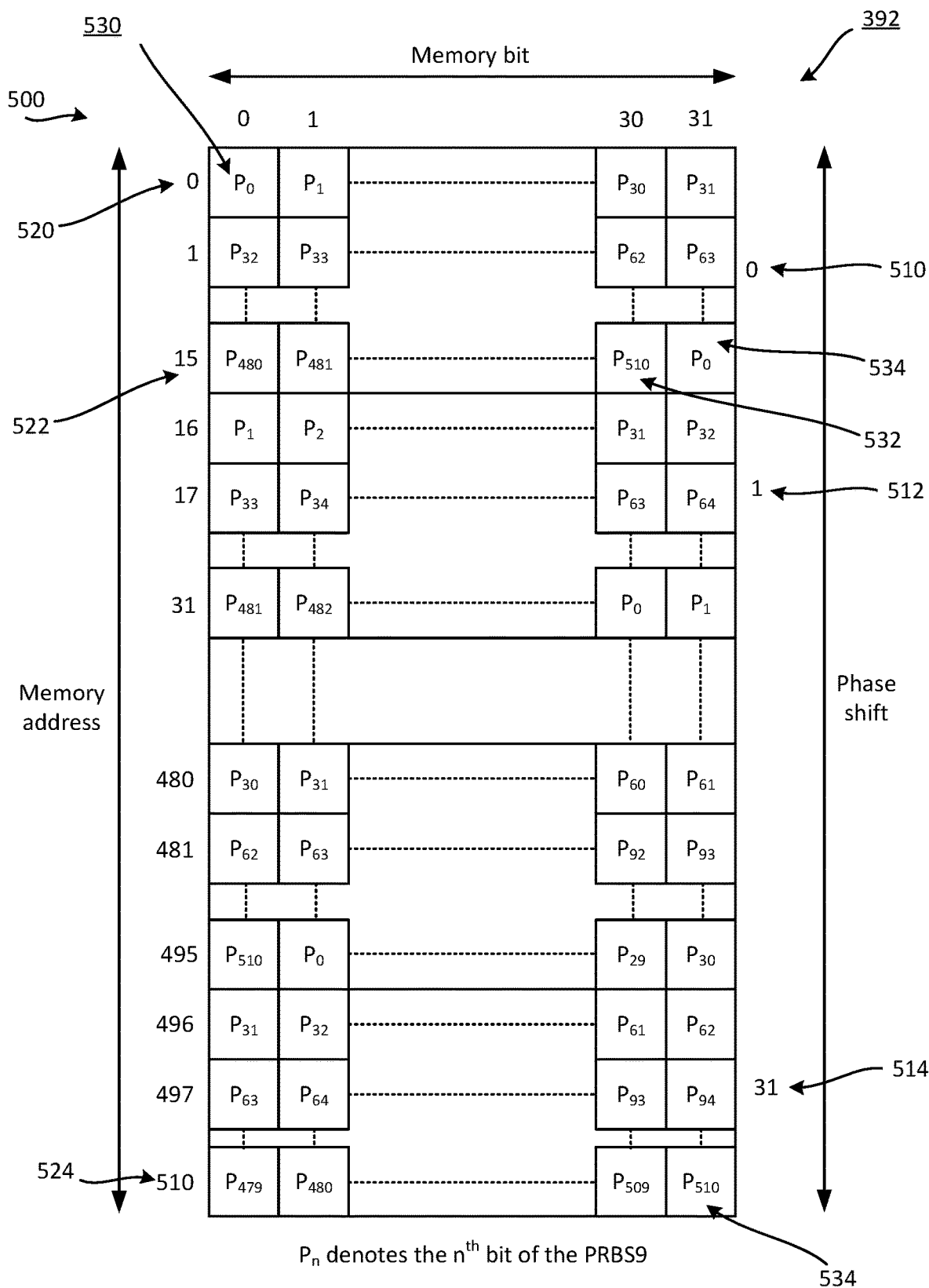
FIG. 5A illustrates an example reference signal stored in a memory at a device under test.

FIG. 5A illustrates an example reference signal 34, which includes multiple phase-shifted versions of a sequence, stored in a memory (e.g., memory 392).

In one implementation, the reference signal 34 may include a plurality of consecutive phase-shifted versions of a sequence (referred to as a plurality of sequences) which may be generated from the sequence using, for example, a shift register. In some implementations, each sequence may be a PRBS, for example, PRBS9, which has a length of 511 bits. The plurality of sequences (for example, 8, 16, 24, 32, etc. sequences, which may depend on the memory structure), to accommodate the length of PRBS9, may be pre-computed or pre-generated (e.g., externally, on-chip, etc.) and stored (e.g., loaded) in the memory 392 to save time or conserve processing resources.

In one example implementation shown in FIG. 5A, to accommodate the length of the PRBS9 sequence (e.g., length of PRBS9 sequence=$2^9-1$=511 bits), consecutive sequences may be stored in a row in the memory 392. In other words, consecutive sequences may be stored in the memory 392 in a way (e.g., in rows) such that a last subsequence is word aligned (or memory word aligned). For example, the first sequence, which may be referred to as sequence 0 (510) may be stored in the memory starting at bit 0 ($P_0$) 530 of memory address 0 (520) and ending at memory bit 30 ($P_{510}$) 532 of memory address 15 (522). The last subsequence 522 of sequence 0 (510) may be word aligned with a following sequence (512) starting at memory bit 31 ($P_0$) 534 of memory address 15 (522). In other words, to store sequences in a memory, the last subsequence of a sequence may be memory word aligned with the following sequence, and applies to any sequence length and to any memory. In other words, the last bit (bit 31) of the last memory address (address 510) stores $P_{510}$. That is, consecutive sequences are stored in a row until the condition (the last bit of the last memory address storing $P_{510}$) is satisfied. This mechanism allows for efficient comparison, e.g., word-by-word comparison or 32-bit comparison for detecting mismatched bits to compute error rates for determining metrics, e.g., BER, PER, etc.

In some implementations, for a 32-bit data memory shown in FIG. 5A, the memory footprint for storing the 32 sequences (e.g., sequences 0-31) is 2044 bytes (e.g., 511*32=2044 bytes or 16,352 bits). The memory footprint may be reduced to 511 or 1022 bytes by using 8 or 16-bit memory addresses, respectively, which may result in higher processing loads (e.g., additional logical shift operations). In other words, the plurality of phase-shifted versions of the sequence are stored with last subsequences of the plurality of phase-shifted versions memory such that they are word, or half-word, or byte aligned.

Figure 5B:
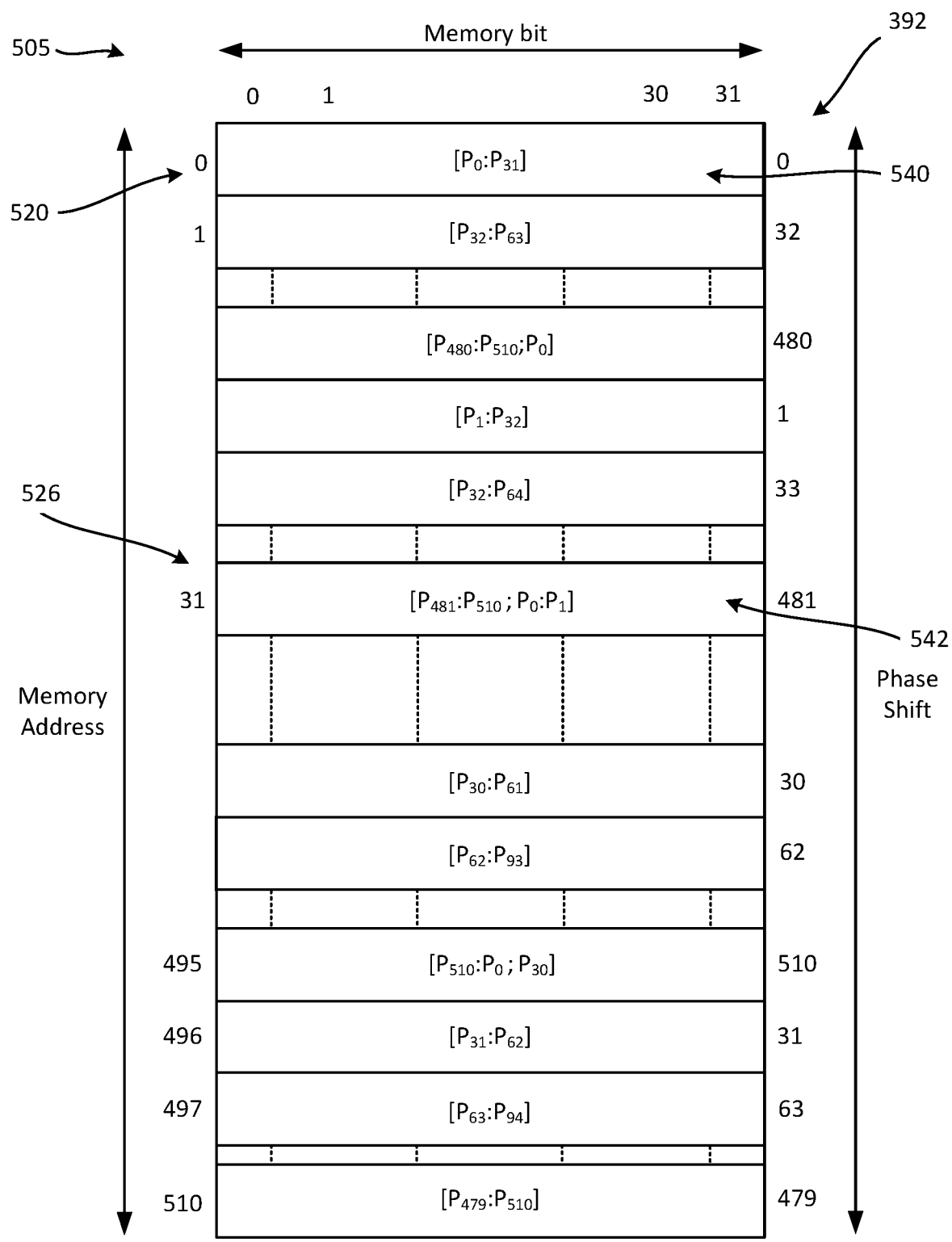
FIG. 5B illustrates storing of word-lines of a reference signal in a memory of a device under test.

FIG. 5B illustrates storing of word-lines of a reference signal 34 in a memory (e.g., memory 392) based on the example implementation of FIG. 5A. For example, the first word-line 540 stored at memory address 0 (520) includes bits shown as [P0:P31] 540. As another example, a word-line 542 stored at memory address 31 (526) includes bits shown as [P481:P510; P0:P1] which includes end portion of one sequence, sequence 0 (e.g., [P481:P510]) and beginning portion, e.g., [P0:P1], of the following sequence, sequence 1 (512). As another example, a word-line at address memory 510 includes bits [P479: P510], where P510 being the last bit of the PRBS9 sequence occupies the last bit of the last address.

In other words, as shown in FIGS. 5A and 5B, consecutive phased-shifted versions of PRBS9 may be stored in a row (e.g., in a loop fashion) until the last bit of the reference signal 534 (e.g., P510 in FIG. 5A) coincides with the last bit (for example, bit 31) of memory address 510 (524). For example, the memory may be read linearly. That is, after reading memory address 510 (524) subsequence [P479: P510], the pointer may be reinitialized to the memory address 0 (subsequence [P0:P31]) to ensure continuity of the sequence (or code). This is due to the length of PRBS9 (e.g., 511 bits) which is not an integer multiple of 32. The example mechanism described above aligns the PRBS9 with the memory even though the length of the PRBS9 is 511 bits.

Figure 5C:
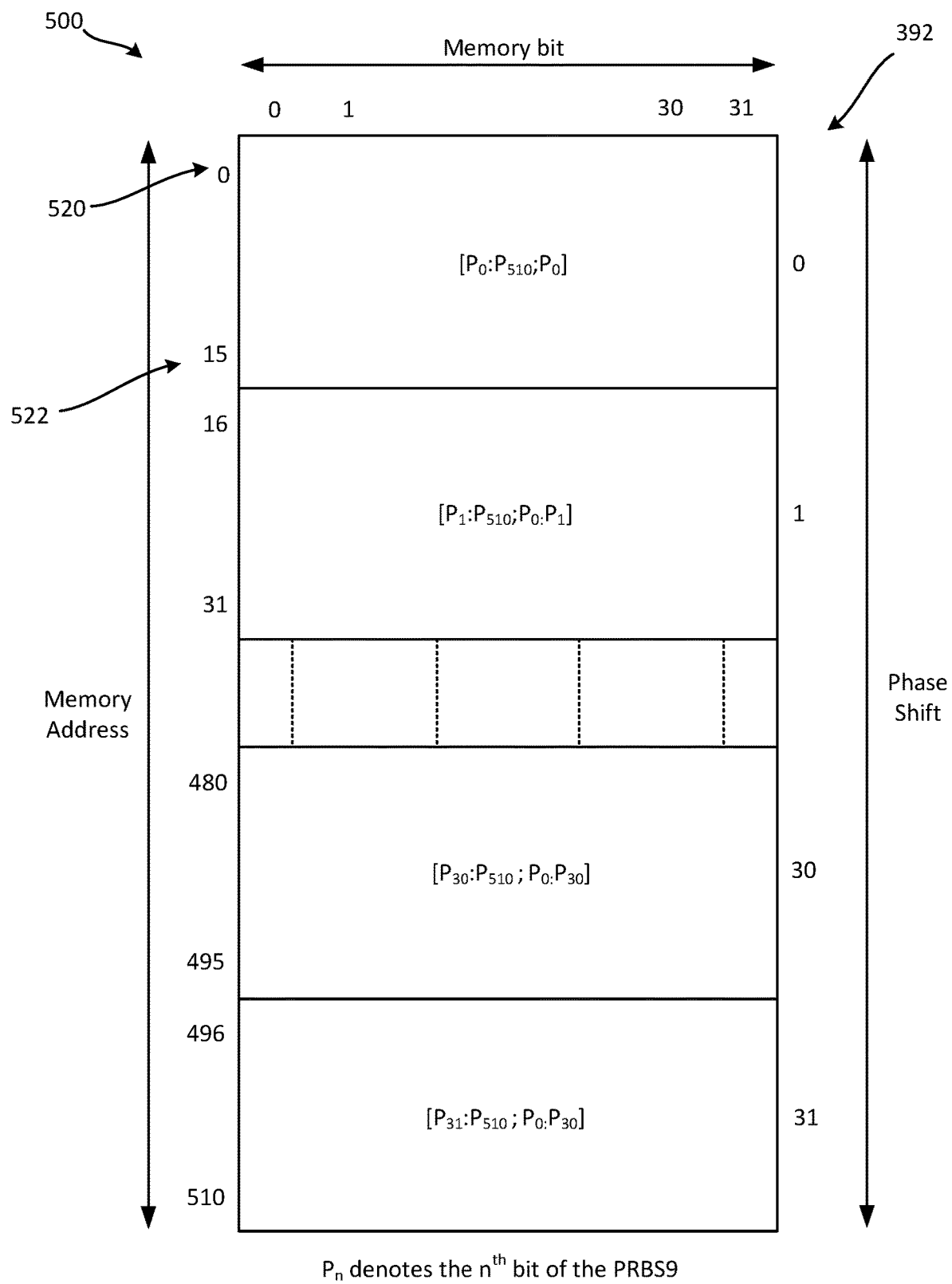
FIG. 5C illustrates blocks including portions of phase-shifted versions of a sequence stored in a memory of a device under test.

FIG. 5C illustrates blocks including portions of phase-shifted versions of a sequence 34 that are stored in the memory 392 as illustrated in FIGS. 5A-5B. In some implementations, each block may include portions of at least two sequences of a PRBS (e.g., PRBS9).

In one example implementation, the PRBS9 may be stored using, for example, 32-bit wide combinations, so that all the plurality of sequences of the PRBS9 are stored in the memory 392. This may allow for relatively less-complex comparison of the digital test signal 32 with the reference signal 34 on a word-line basis (e.g., 32-bit word comparison). The synchronization between the digital test signal 32 and the PRBS9 (e.g., multiple phase-shifted versions of the reference signal 34 shown in FIG. 5A) may be performed in multiple ways.

In some implementations, the synchronization of the digital test signal 32 with the reference signal 34 may be performed prior to the comparison. However, the data phase of the digital test signal 32 may be unknown as the test signal 30 is being continuously looped. As a result, the synchronization may include searching all possible phases of the PRBS9 (e.g., 511 phase shifts) and performing the synchronization when the correlation between the digital test signal 32 and the PRBS9 satisfies a threshold condition (e.g., correlation is maximized). In some other implementations, because of the properties of the PRBS9 and the low BER target (e.g., $10^{-3}$), the correlation may be computed over a subsequence (e.g., 520, 522, etc.) of a sequence of the PRBS9. In an example implementation, the correlation length (e.g., number of bits used for correlation) may be chosen to be an integer multiple of the memory width (e.g., integer multiple of 32) and the correlation length may be computed between a portion of the digital test signal 32 (e.g., $2^9-1$=511) and the plurality of subsequences. Since each memory address location represents a different phase-shifted version of the PRBS9 subsequence [P0:P31], the memory can be read linearly. This can result in the synchronization process being efficient since no logical shift operations are required.

As an example, a 32-bit portion of the digital test signal 32 may be compared with word-lines (e.g., 32 bits each) stored in the memory 392 until a match is found. In response to a match being found, the digital test signal 32 may be synchronized with the memory 392 at the matching word-line address location. Thus, subsequent 32-bit word-lines of the digital test signal 32 may be compared with the subsequently addressed word-lines stored in the memory 392.

In another example implementation, the receiver 302 may have basic packet handling functionalities capable of detecting a pre-defined pattern (e.g., for detecting a 32-bit sync word of a received Bluetooth LE packet). In such implementations, by defining the [$P_{479}:P_{510}$] subsequence as the pattern to search for, the digital test signal 32 stored in the receiver memory 370 (e.g., FIFO memory 370 of the receiver 302) may be automatically aligned with the bit $P_0$ of the PRBS9 sequence. In another example implementations, in response to synchronization being achieved (e.g., after performing a search over all (or a subset of) the possible phases), the memory pointer of the PRBS9 sequence may be initialized at the memory address location with content that matches the digital test signal. In some implementations, if needed, the pointer is adjusted in order to compensate for the time spent during the search process (time is translated into an equivalent phase shift). In some implementations, the storing of consecutive versions in a row, as described above in reference to FIGS. 5A and 5B, applies to FIG. 5C as well where subsequence [P479:P510] may be used as a reference so that the next subsequence read is [P0:P31] at memory address 0 (520).

In some implementations, after using the pattern detection mechanism, the pointer may be initialized to the first address. For each new received data, the memory pointer may be linearly incremented until it reaches the $2^9-2$ memory address. In some implementations, the pointer may be reinitialized to the first address in order to ensure the sequence continuity. In some implementations, the tracking between the PRBS9 sequence and the data can be efficient since the correlations may be computed on native 32-bit operands that are read linearly from the memory without any logical shift operations.

In some implementations, a non-transitory computer-readable storage medium may be configured to store instructions that when executed cause a processor to perform a process. In one example implementation, the process may include receiving, at a device under test (DUT), a test signal, converting, by the DUT, the test signal into a digital test signal and storing the digital test signal in a receiver memory portion, the digital test signal being a bit stream generated from the test signal, identifying, by the DUT, when a pre-defined number of bits of the bit stream are available in the receiver memory portion. The process may further include performing, by the DUT, in response to the identifying, a logic operation on the bit stream and a reference signal, and generating a test result based on the logic operation, the reference signal including a plurality of phase-shifted versions of a sequence, and the reference signal pre-generated and stored in a DUT memory portion; and determining, by the DUT, whether the test result satisfies a condition.

It will also be understood that when an element, such as a transistor or resistor, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application (if included) may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Implementations may implemented as a computer program product, i.e., a computer program tangibly embodied in an information carrier, e.g., in a machine readable storage device (computer-readable medium) or in a propagated signal, for processing by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand alone program or as a module, component, subroutine, or other unit suitable for use in a computing environment. A computer program can be deployed to be processed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application specific integrated circuit).

Processors suitable for the processing of a computer program include, by way of example, both general and special purpose microprocessors, and any one or more processors of any kind of digital computer. Generally, a processor will receive instructions and data from a read only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto optical disks, or optical disks. Information carriers suitable for embodying computer program instructions and data include all forms of non volatile memory, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory may be supplemented by, or incorporated in special purpose logic circuitry.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:
1. An apparatus, comprising:
 a memory configured to store a reference signal that includes a plurality of phase-shifted sequences;
 an antenna configured to receive a test signal that corresponds to a repeated bit stream;

a receiver configured to store the repeated bit stream in the memory and identify when a pre-defined number of bits of the repeated bit stream are available in the memory; and a processor configured to perform a self-test, the self-test including:
synchronizing the repeating bit stream and the reference signal based on a correlation between the repeated bit stream and each of the phase-shifted sequences;
performing a logic operation on the synchronized repeating bit stream and the reference signal sequence; and
generating a test result based on the logic operation satisfying a condition.

2. The apparatus of claim 1, wherein the self-test is initiated without an external trigger from a source of the test signal.

3. The apparatus of claim 1, wherein the plurality of phase shifted sequences are phase-shifted versions of a pseudo-random binary sequence (PRBS), and wherein each of the plurality of phase-shifted versions of the sequence are stored at a particular memory address in the memory.

4. The apparatus of claim 1, wherein the logic operation includes at least one of an exclusive OR (XOR) operation, a summation operation, or a result operation.

5. The apparatus of claim 1, wherein the processor is configured to perform the logic operation that includes an exclusive OR (XOR) operation, and wherein the XOR operation includes:
comparing each bit of the bit stream with a corresponding bit of the reference signal; and
generating, for each comparison, a high logic value when a bit of the bit stream fails to match the corresponding bit of the reference signal or a low logic value when the bit of the bit stream matches the corresponding bit of the reference signal.

6. The apparatus of claim 1, wherein the processor is configured to perform the logic operation that includes exclusive OR (XOR) and summation operations, and
wherein the XOR operation includes:
comparing each bit of the bit stream with a corresponding bit of the reference signal;
generating, for each comparison, a high logic value when a bit of the bit stream fails to match the corresponding bit of the reference signal or a low logic value when the bit of the bit stream matches the corresponding bit of the reference signal, and
wherein the summation operation includes:
adding generated high logic values to determine a total number of bits that failed to match and adding generated low logic values to determine a total number of matched bits.

7. The apparatus of claim 1, wherein the processor is configured to perform the logic operation that includes exclusive OR (XOR), summation, and result operations, and
wherein the XOR operation includes:
comparing each bit of the bit stream with a corresponding bit of the reference signal;
generating, for each comparison, a high logic value when a bit of the bit stream fails to match the corresponding bit of the reference signal or a low logic value when the bit of the bit stream matches the corresponding bit of the reference signal,
wherein the summation operation includes:
adding generated high logic values to determine a total number of bits that failed to match and adding low logic values to determine a total number of matched bits; and
wherein the result operation includes:
determining whether the test result satisfies the condition based on a test criterion configured at the apparatus, wherein the test criterion is based on the total number of bits that failed to match.

8. The apparatus of claim 1,
wherein the apparatus is a first device under test (DUT) and the test signal is transmitted wirelessly by a second DUT; and
wherein the test results include a quality of reception in an environment of the first DUT and the second DUT.

9. An apparatus, comprising:
a memory configured to store a reference signal that includes a plurality of phase-shifted sequences;
a receiver configured to:
receive a test signal that corresponds to a repeated bit stream;
store the repeated bit stream in the memory;
identify when a pre-defined number of bits of the repeated bit stream are available in the memory; and
a processor configured to:
perform, in response to the identifying, a self-test, the self-test including:
synchronizing the repeating bit stream and the reference signal based on a correlation between the repeated bit stream and each of the phase-shifted sequences;
performing a logic operation on the synchronized repeating bit stream and the reference signal sequence; and
generating a test result based on the logic operation satisfying a condition.

10. The apparatus of claim 9, wherein the self-test is initiated without an external trigger from a source of the test signal.

11. A method, comprising:
receiving, at a device under test (DUT), a test signal that corresponds to a repeated bit stream;
storing the repeated bit stream in a receiver memory portion;
identifying, by the DUT, when a pre-defined number of bits of the repeated bit stream are available in the receiver memory portion;
performing, by the DUT, in response to the identifying, a self-test, the self-test including:
synchronizing the repeating bit stream and a reference signal including a plurality of phase-shifted sequences, the synchronizing based on a correlation between the repeated bit stream and each of the phase-shifted sequences;
performing a logic operation on the synchronized repeating bit stream and the reference signal sequence; and
generating a test result based on the logic operation satisfying a condition.

12. The method of claim 11, wherein the self-test is initiated without an external trigger from a source of the test signal.

13. The method of claim 11, wherein the plurality of phase shifted sequences are phase-shifted versions of a pseudo-random binary sequence (PRBS), and wherein each of the plurality of phase-shifted versions of the sequence are stored at a particular memory address in the memory.

14. The method of claim 11, wherein the logic operation includes at least one of an exclusive OR (XOR) operation, a summation operation, or a result operation.

15. The method of claim 11, wherein the logic operation includes performing an exclusive OR (XOR) operation, and wherein the XOR operation includes:
   comparing each bit of the bit stream with a corresponding bit of the reference signal; and
   generating, for each comparison, a high logic value when a bit of the bit stream fails to match the corresponding bit of the reference signal or a low logic value when the bit of the bit stream matches the corresponding bit of the reference signal.

16. The method of claim 11, wherein the logic operation includes performing exclusive OR (XOR) and summation operations,
   wherein the XOR operation includes:
      comparing each bit of the bit stream with a corresponding bit of the reference signal;
      generating, for each comparison, a high logic value when a bit of the bit stream fails to match the corresponding bit of the reference signal or a low logic value when the bit of the bit stream matches the corresponding bit of the reference signal, and
   wherein the summation operation includes:
      adding generated high logic values to determine a total number of bits that failed to match and adding generated low logic values to determine a total number of matched bits.

17. The method of claim 11, wherein the logic operation includes performing exclusive OR (XOR), summation, and result operations, comprising:
   wherein the XOR operation includes:
      comparing each bit of the bit stream with a corresponding bit of the reference signal;
      generating, for each comparison, a high logic value when a bit of the bit stream fails to match the corresponding bit of the reference signal or a low logic value when the bit of the bit stream matches the corresponding bit of the reference signal,
   wherein the summation operation includes:
      adding generated high logic values to determine a total number of bits that failed to match and adding generated low logic values to determine a total number of matched bits; and
   wherein the result operation includes:
      determining whether the test result satisfies the condition based on a test criterion configured at the DUT, wherein the test criterion is based on the total number of bits that failed to match.

* * * * *